United States Patent [19]

Culmer

[11] 4,198,580
[45] Apr. 15, 1980

[54] MOSFET SWITCHING DEVICE WITH CHARGE CANCELLATION

[75] Inventor: Daniel D. Culmer, Sunnyvale, Calif.

[73] Assignee: National Semiconductor Corporation, Santa Clara, Calif.

[21] Appl. No.: 910,698

[22] Filed: May 30, 1978

[51] Int. Cl.² .................. H03K 17/72; H03K 17/16; H03K 17/66; H01L 29/78
[52] U.S. Cl. .................. 307/251; 307/200 B; 307/304; 357/23; 357/41
[58] Field of Search .................. 307/200 B, 251, 304; 357/23, 41; 328/162

[56] References Cited

U.S. PATENT DOCUMENTS

| | | | |
|---|---|---|---|
| 3,983,414 | 9/1976 | Stafford et al. | 307/251 |
| 4,075,509 | 2/1978 | Redfern | 307/251 |
| 4,081,699 | 3/1978 | Hirt et al. | 307/251 X |
| 4,130,766 | 12/1978 | Patel et al. | 307/200 B X |

Primary Examiner—Larry N. Anagnos
Attorney, Agent, or Firm—Brown & Martin

[57] ABSTRACT

A MOSFET switching device, including first and second control terminals; a first MOSFET having its gate connected to the first control terminal; a second MOSFET having its gate connected to the second control terminal and its source and drain both connected to the source of the first MOSFET; and a third MOSFET having its gate connected to the second control terminal and its source and drain both connected to the drain of the first MOSFET. When complementary control signals are applied to the first and second control terminals, charge spikes occurring at the source and drain of the first MOSFET when the conduction state of the first MOSFET is changed are cancelled by charge spikes occurring simultaneously in the second and third MOSFET's.

3 Claims, 5 Drawing Figures

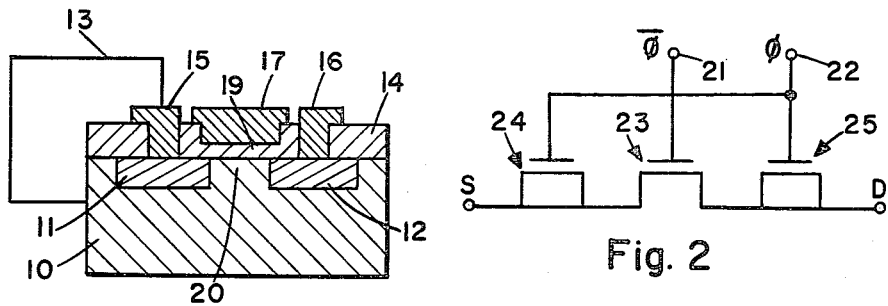
Fig. 1 PRIOR ART
Fig. 2
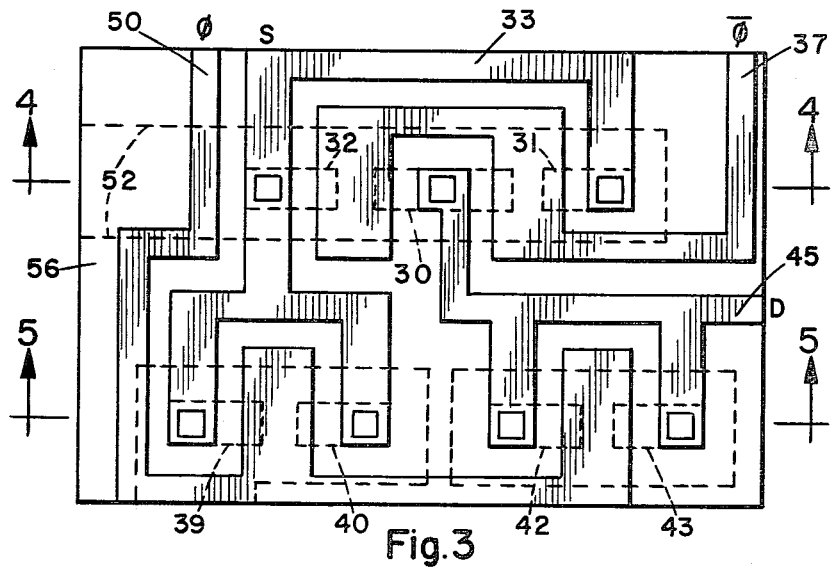
Fig. 3
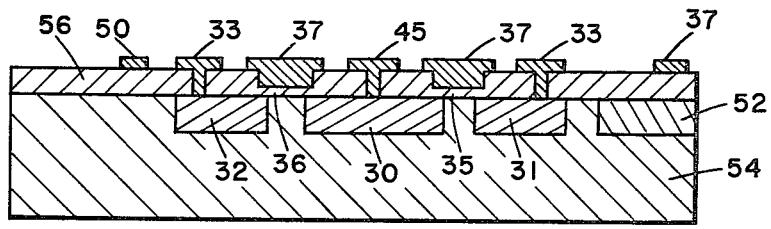
Fig. 4
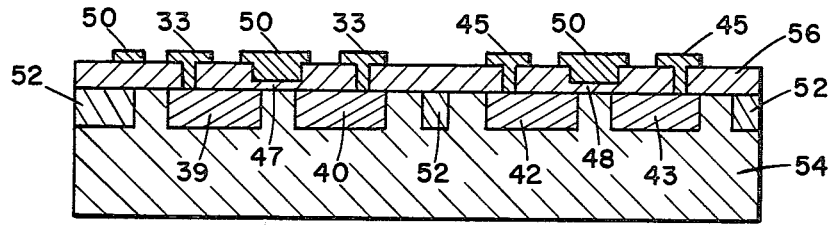
Fig. 5

MOSFET SWITCHING DEVICE WITH CHARGE CANCELLATION

BACKGROUND OF THE INVENTION

The present invention generally pertains to MOSFET switching devices and is particularly directed to cancelling the charge spikes occurring at the source and drain of the MOSFET when the conduction state of the MOSFET is changed.

The basic structure of a typical MOSFET switching device is shown in FIG. 1. This device is an enhancement mode MOSFET (metal-oxide-semiconductor field effect transistor). The device includes a silicon substrate 10 of either p-type or n-type material containing diffusions 11, 12 of the oppositive p-type or n-type material. A silicon dioxide layer 14 covers the substrate 10 and the diffusions 11 and 12. Conductive material contacts 15, 16, 17 are formed in the silicon dioxide layer 14. The diffusion 11 is the source and the diffusion 12 is the drain. Contact 15 extends through the silicon dioxide layer 14 and makes contact with the source 11. The source contact 15 also is electrically connected to the silicon substrate 10 by a conductor 13. Contact 16 extends through the silicon dioxide layer 14 and makes contact with the drain 12. Contact 17 contacts the gate 19. The gate 19 is a thin zone within the silicon oxide layer 14 beneath the contact 17.

When a voltage of a given polarity with respect to the voltage applied to the source contact 15 is applied to the gate contact 17, an electric field is established through the thin silicon dioxide gate 19 into a channel 20 which extends between the source 11 and drain 12 and thereby enables current to flow from the source 11 to the drain 12. When this occurs, the MOSFET is said to be rendered conductive.

However, when the electric field is established in the channel 20 an electric field is also established within the thin silicon dioxide gate 19 between the gate contact 17 and the source 11, and between the gate 19 and the drain 12.

Thus, when the MOSFET is rendered conductive, charge spikes of one polarity appear at its source and drain; and when the MOSFET is rendered non-conductive, charge spikes of the opposite polarity appear at its source and drain.

These charge spikes which occur at the source and drain when the conduction state of the MOSFET is changed can be particularly troublesome in some circuit applications for MOSFET switching devices. For example, when a MOSFET switching device is connected to a capacitance in a sample and hold circuit, the capacitance is charged to a given voltage when the switch is closed (rendered conductive). It is desired that when the MOSFET switch is opened (rendered non-conductive), that the charged voltage of this capacitance remain unchanged and not be affected by the charge spikes occurring at the source or drain of the MOSFET.

SUMMARY OF THE INVENTION

The present invention provides a MOSFET switching device wherein charge spikes occurring at the source and drain of a MOSFET when the conduction state of the MOSFET is changed are cancelled within the device, so as to prevent such charge from bleeding off to circuit components connected to the MOSFET switching device.

The present invention is a MOSFET switching device including first and second control terminals; a first MOSFET having its gate connected to the first control terminal; a second MOSFET having its gate connected to the second control terminal and its source and drain both connected to the source of the first MOSFET; and a third MOSFET having its gate connected to the second control terminal and its source and drain both connected to the drain of the first MOSFET. When complementary control signals are applied to the first and second control terminals charge spikes occurring at the source and drain of the first MOSFET when the conduction state of the first MOSFET is changed and cancelled by charge spikes occurring simultaneously in the second and third MOSFETs.

Preferably, the second and third MOSFETs each are approximately one-half the size of the first MOSFET in order that the amount of charge in the charge spikes of one polarity occurring in the first MOSFET is more completely balanced by the amount of charge in the charge spikes of the opposite polarity occurring in the second and third MOSFET's. In one preferred embodiment of a MOSFET switching device according to the present invention, the first MOSFET consists of a pair of identical MOSFET's having a common drain, and the combined size of the pair of identical MOSFET's is approximately the same as the combined size of the second and third MOSFET's.

The present invention is applicable to both enhancement mode and depletion mode MOSFET switching devices.

BRIEF DESCRIPTION OF THE DRAWING

FIG. 1 is a combined schematic and cross-sectional view of a typical prior art MOSFET switching device.

FIG. 2 is a schematic circuit diagram of the MOSFET switching device of the present invention.

FIG. 3 is a plan view of a preferred embodiment of a MOSFET switching device according to the present invention.

FIG. 4 is a cross-sectional view of the MOSFET switching device of FIG. 3 taken along lines 4—4.

FIG. 5 is a cross-sectional view of the MOSFET switching device of FIG. 3 taken along line 5—5.

DESCRIPTION OF THE PREFERRED EMBODIMENT

A schematic circuit diagram of a MOSFET switching device according to the present invention is shown in FIG. 2. The MOSFET switching device of FIG. 2 includes a first control terminal 21, a second control terminal 22, a first MOSFET 23, a second MOSFET 24, and a third MOSFET 25. The first MOSFET 23 has its gate connected to the first control terminal 21. The second MOSFET 24 has its gate connected to the second control terminal 22, and its source and drain both connected to the source of the first MOSFET 23. The third MOSFET 25 has its gate connected to the second control terminal 22 and its source and drain both connected to the drain of the first MOSFET 23. The second and third MOSFET's 24, 25 each are approximately one-half the size of the first MOSFET 23.

When complementary control signals $\bar{\phi}$ and $\phi$ are applied to the first and second control terminals 21 and 22 respectively, charge spikes occurring at the source and drain of the first MOSFET 23 when the conduction state of the first MOSFET is changed are cancelled by charge spikes occurring simultaneously in the second and third MOSFET's 24 and 25.

A monolithic integrated circuit chip embodiment of the MOSFET switching device of the present invention is shown in FIGS. 3, 4 and 5. In this embodiment, the first MOSFET consists of a pair identical MOSFET's having a common drain 30. The pair of MOSFET's have sources 31 and 32 which are connected together by a conductive layer 33; and gates 35 and 36, which are connected together by a conductive layer 37. The conductive layer 37 may be connected to the first control terminal for receiving the control signal $\bar{\phi}$.

The second MOSFET has a source 39 and a drain 40, both of which are connected to the sources 31 and 32 of the first MOSFET by the conductive layer 33.

The third MOSFET has a source 42 and a drain 43, both of which are connected to the drain 30 of the first MOSFET by the conductive layer 45.

The gate 47 of the second MOSFET and the gate 48 of the third MOSFET are connected together by the conductive layer 50. The conductive layer 50 may be connected to the second control terminal for receiving the second control signal $\phi$.

The combined size of the pair of identical MOSFET's forming the first MOSFET is approximately the same as the combined size of the second and third MOSFET's.

The MOSFET switching device of FIGS. 3, 4 and 5 is a p-channel device; and therefore, it further includes a guardband diffusion 52 in the substrate 54. The guardband 52 prevents parasitic MOS devices from being formed beneath the conductive layers 33, 37, 45 and 50. The guardband is an n plus-type material. The substrate 54 is an n minus-type material. The source and drain diffusions are a p plus-type material. A silicon dioxide layer 56 covers the substrate 54 and the source, drain and guardband diffusions.

I claim:

1. A MOSFET switching device, comprising
   first and second control terminals;
   a first MOSFET having its gate connected to the first control terminal;
   a second MOSFET having its gate connected to the second control terminal and its source and drain both connected to the source of the first MOSFET; and
   a third MOSFET having its gate connected to the second control terminal and its source and drain both connected to the drain of the first MOSFET;
   wherein when complementary control signals are applied to the first and second control terminals, charge spikes occurring at the source and drain of the first MOSFET device when the conduction state of the first MOSFET is changed are cancelled by charge spikes occurring simultaneously in the second and third MOSFET's.

2. A MOSFET switching device according to claim 1, wherein the second and third MOSFET's each are approximately one-half the size of the first MOSFET.

3. A MOSFET switching device according to claim 1, wherein the first MOSFET consists of a pair of identical MOSFET's having a common drain, and the combined size of the pair of identical MOSFET's is approximately the same as the combined size of the second and third MOSFET's.

* * * * *